US005705081A

United States Patent [19]

Inazawa et al.

[11] Patent Number: 5,705,081

[45] Date of Patent: Jan. 6, 1998

[54] ETCHING METHOD

[75] Inventors: Koichiro Inazawa, Tokyo; Shin Okamoto, Kofu; Yoshifumi Tahara, Tokyo, all of Japan

[73] Assignee: Tokyo Electron Limited, Japan

[21] Appl. No.: 531,713

[22] Filed: Sep. 21, 1995

[30] Foreign Application Priority Data

Sep. 22, 1994 [JP] Japan .................................... 6-254448

[51] Int. Cl.[6] .................................................. H01L 21/3065

[52] U.S. Cl. .......................... 216/71; 156/345; 156/643.1

[58] Field of Search ................................ 156/345, 643.1; 216/71; 204/298.37, 298.34; 315/111.51; 118/723 E

[56] References Cited

U.S. PATENT DOCUMENTS

| | | | |
|---|---|---|---|
| 4,357,195 | 11/1982 | Gorin | 156/345 |
| 4,863,549 | 9/1989 | Grünwald | 156/345 |
| 4,935,661 | 6/1990 | Heinecke et al. | 315/111.21 |
| 4,950,377 | 8/1990 | Huebner | 204/192.32 |
| 5,160,408 | 11/1992 | Long | 156/656 |
| 5,411,624 | 5/1995 | Hirano et al. | 156/345 |
| 5,431,774 | 7/1995 | Douglas | 216/57 |

FOREIGN PATENT DOCUMENTS 63-033825 2/1988 Japan .

*Primary Examiner*—R. Bruce Breneman
*Assistant Examiner*—George Goudreau
*Attorney, Agent, or Firm*—Graham & James LLP

[57] ABSTRACT

An etching apparatus comprises a pair of electrodes provided to face each other in a processing vessel, a permanent magnet for forming a magnetic field substantially parallel to a surface of a to-be-processed object which is placed between the paired electrodes, a gas introduction section for introducing etching gas into the processing vessel, a high-frequency generator for applying high-frequency voltage to the paired electrodes for generating plasma, and a high-frequency control section for preventing plasma from being unevenly distributed by starting and stopping the application of high-frequency voltage by the high-frequency generator at fixed intervals.

7 Claims, 2 Drawing Sheets

OUTER SIGNAL S1

10V

0V

T1

T2

RF POWER

200W

0

TIME

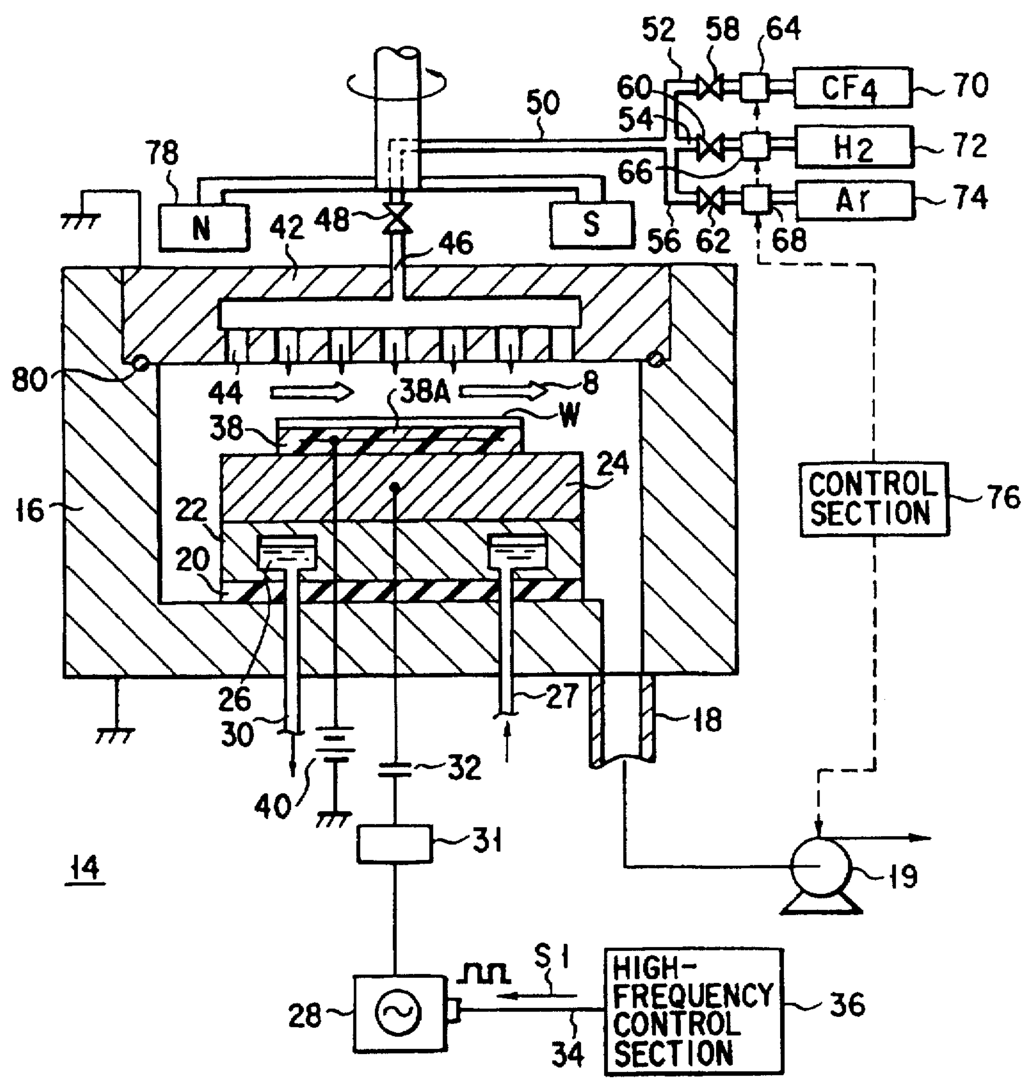
F I G. 1
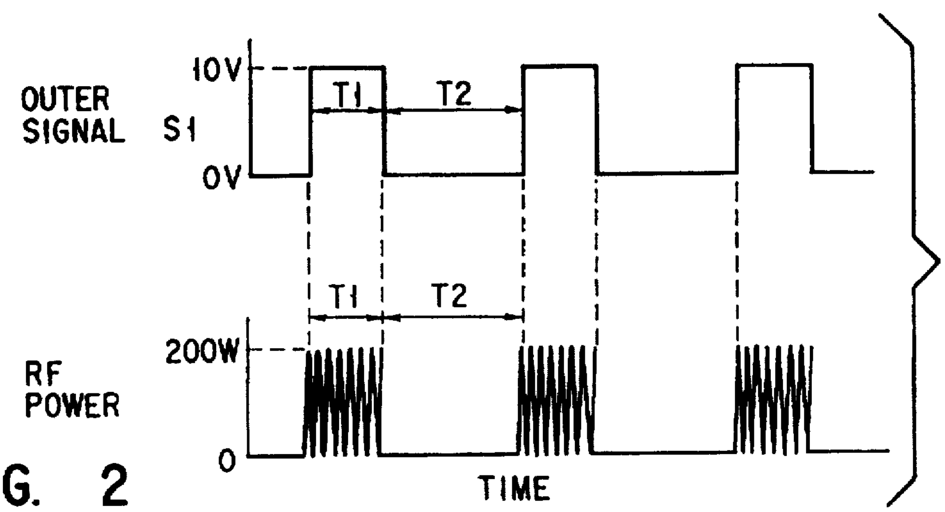
F I G. 2

ETCHING METHOD

BACKGROUND OF THE INVENTION

1. Field of the Invention

The present invention relates to an etching apparatus and an etching method for etching a film on a semiconductor wafer and the like.

2. Description of the Related Art

Etching process for forming a desired fine pattern on a thin film laminated on a wafer is carried out when manufacturing semiconductor devices.

The etching process employs a photolithographic technique for forming a fine pattern circuit. With the photolithographic technique, photoresist which reacts on visible rays or ultraviolet rays is uniformly applied onto a to-be-etched layer. After the photoresist is dried, light is exposed to the photoresist film by means of a photo-technique, thereby transferring a fine circuit pattern to the film.

A circuit pattern is formed by extracting the exposure portion of the photoresist film, depending on the kind of the photoresist film. Then plasma-etching process is carried out using the circuit pattern as a mask, thereby etching the to-be-etched layer to form a desired pattern thereon.

In the plasma-etching process, etching gas is activated to generate plasma by high-frequency voltage, and electrons and ions in plasma are made to collide with etching gas, so that active elements such as fluorine elements and chlorine elements occur, depending on the kind of the etching gas. The active elements are vaporized and etched by reacting them with components of the thin film provided on a wafer surface.

It is usually known that the more active the elements subjected to etching process occur, the more the etching efficiency is improved. Considering this, a permanent magnet is provided in a processing vessel to form a magnetic field parallel to the wafer surface in a processing space. The frequency of collision of electrons or ions in plasma is increased and the number of active elements grows by pulling them into the magnetic field. The magnetron plasma etching apparatus using the above-mentioned method tends to be employed in many cases.

An explanation will be now given as to a state of the above with reference to FIG. 3. Lower electrode 4, i.e. a susceptor is connected to high-frequency power source 2. To-be-processed semiconductor wafer W is attracted to and held on the upper surface of the lower electrode 4. Upper electrode 6 is provided above the semiconductor wafer to face the wafer. High-frequency voltage is applied between the lower electrode 4 and the upper electrode 6 to thereby generate plasma. Magnetic field 8 parallel to the wafer surface is formed in a processing space above the wafer W by means of a permanent magnet (not shown) which is provided on the upper portion of the processing vessel. Electrons 10 in plasma are attracted into the magnetic field 8 while, according to FIG. 3, attracting the electrons 10 to the lower electrode 4. Whereby the travel length of electrons as well as the generating amount of active elements are increased.

Etching efficiency can be improved by forming the magnetic field 8 parallel to the wafer surface in the processing space. However, drift represented by E (electric field)×B (magnetic field) occurs in electrons. This causes problems that plasma is unevenly distributed and charge-up damage newly occurs.

That is, after the magnetic field 8 parallel to the wafer surface is formed in the processing space, electrons 10 attracted to the lower electrode 4 tend to be unevenly distributed among the upper side of the wafer W by Fleming's left-hand rule, producing portion 13 where electrons are undesirably collected. This phenomenon is referred to as E×B drift.

The electrons attracted to the lower electrode 4 dwell over the wafer W and potential appears across the wafer surface. As mentioned above, if the E×B drift occurs and electrons 10 are unevenly distributed, plasma is also unevenly distributed above the wafer surface. This not only makes etching process uneven but also, as shown in FIG. 5, produces the large potential difference of, e.g. several tens volts, between potential Vde 1 of a portion where a large amount of electrons 10 exist and potential Vde 2 of the remaining portion. The potential difference $\Delta V$ has brought about problems that dielectric breakdown occurs in gate oxide film 12 provided on the wafer surface, current flows and charge-up damage happens.

SUMMARY OF THE INVENTION

The object of the present invention is to provide an etching apparatus and an etching method with which uneven distribution of plasma caused by E×B drift can be prevented.

In order to resolve the above problems, the apparatus of the present invention comprises: a pair of electrodes provided to face each other in a processing vessel; magnetic field formation means for forming a magnetic field substantially parallel to a surface of a to-be-processed object placed between the paired electrodes; a gas introduction section for introducing etching gas into the processing vessel;

a high-frequency generator for applying high-frequency voltage for generating plasma, to the paired electrodes; and a high-frequency control section for starting and stopping application of high-frequency voltage by the high-frequency generator at fixed intervals, to thereby decrease an uneven distribution of plasma.

The method of the present invention comprises the steps of: forming a magnetic field parallel to a surface of a to-be-processed object, which is placed in a processing vessel, and introducing etching gas into the processing vessel; and applying high-frequency voltage for generating plasma to at least one of a pair of electrodes, which are provided to face each other in the processing vessel, starting and stopping application of the high-frequency voltage to the electrode at fixed intervals, to thereby decrease an uneven distribution of plasma, thereby plasma-etching the to-be-processed object.

With this structure, if high-frequency voltage is applied, drift occurs in electrons and the electrons are unevenly distributed. If the application of high-frequency voltage is stopped, the temperature of electrons in plasma drops and the electric field disappears. Hence, electrons which tend to be unevenly distributed during the application of high-frequency voltage, return to their original position. After this operation is repeatedly carried out, E×B drift is prevented from occurring and intermittently disappears. This eliminates a portion where electrons are undesirably collected, and allows uniform distribution of plasma.

Therefore, a large potential difference on the surface of the to-be-processed object and charge-up damage can be prevented.

In this case, it is preferable that high-frequency voltage application time is set at several tens milliseconds. If it is longer than several tens milliseconds, E×B drift phenomenon becomes conspicuous. Also, it is preferable that the high-frequency voltage-application stop time is set at a range of a life of electrons in plasma. If it is set longer than the electron life, plasma undesirably disappears.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 1 is an explanatory sectional view showing a bipolar magnetron plasma etching apparatus according to one embodiment of the present invention.

FIG. 2 is a chart showing high-frequency voltage and the like to be applied by using the method of the present invention.

DETAILED DESCRIPTION OF THE PREFERRED EMBODIMENT

Figure 3:
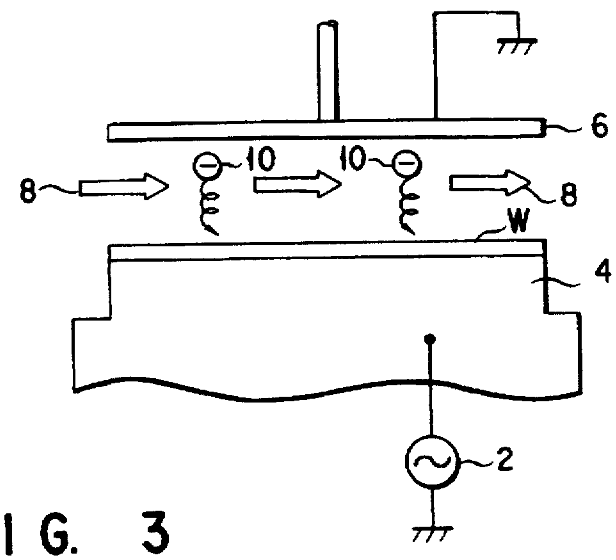
FIG. 3 is a view showing the direction of the magnetic field and the travel of electrons in the processing space.
Figure 4:
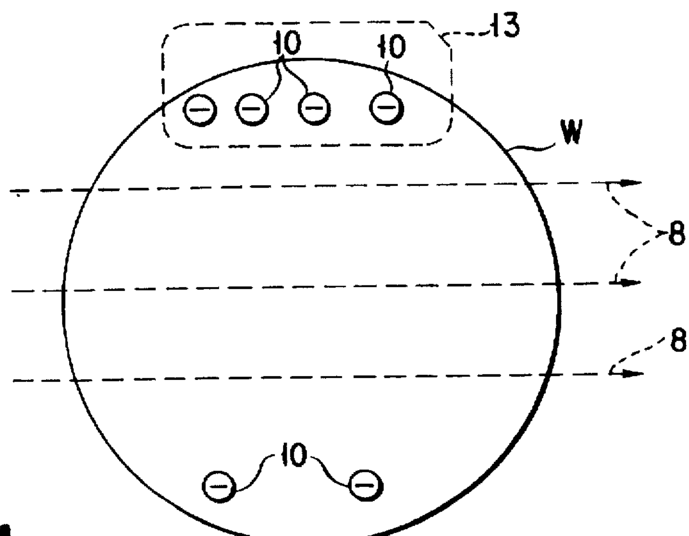
FIG. 4 is a view showing a state in which electrons are undesirably collected above the surface of the semiconductor wafer.
Figure 5:
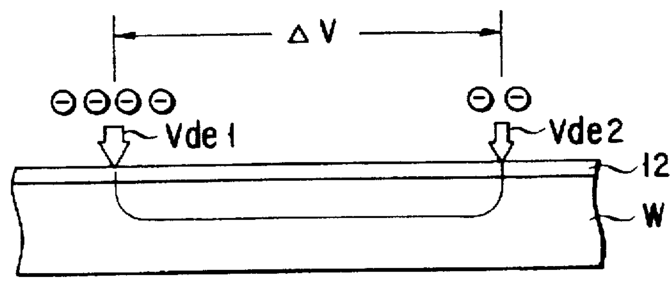
FIG. 5 is a view showing a state in which charge-up damage occurs on the oxide film provided on the surface of the semiconductor wafer.

An embodiment of an etching method and etching apparatus according to the present invention will now be described in detail with reference to the drawings.

FIG. 1 is a sectional view showing a bipolar magnetron etching apparatus according to an embodiment of the present invention. FIG. 2 shows high-frequency voltage and the like applied by means of the etching method of the present invention.

First, the plasma etching apparatus according to the embodiment of the present invention will be described.

As the drawings show, the bipolar magnetron plasma etching apparatus comprises air-tight processing vessel 16 made of aluminum and the like. The processing vessel 16 is connected to the ground. A plurality of exhaust pipes 18, which are connected to the bottom of the processing vessel 16, are connected to vacuum pump 19 which can control displacement. The exhaust pipes 18 and the vacuum pump 19 form gas exhaust means which can uniformly exhaust gas in the processing vessel 16 whose capacity is, for example, about 3.5 liters.

Insulating plate 20 made of, e.g. ceramic is provided at the center of the bottom of the processing vessel 16. On the insulating plate 20 is provided susceptor support base 22 made of, e.g. aluminum. Susceptor 24 made of, e.g. aluminum, as a lower electrode is provided on the upper surface of the support base 22.

Cooling chamber 26 for maintaining the susceptor 24 at temperatures in the predetermined range is formed inside the susceptor support base 22. Refrigerant introduction pipe 27 and refrigerant emission pipe 30 going through the base of the processing vessel 16 are connected to the cooling chamber 26. The susceptor 24 can be maintained at desired temperatures ranging, for example, from −200° C. to +200° C. by circulating refrigerant inside the cooling chamber 26.

High-frequency generator 28 for oscillating a high-frequency voltage of, e.g. 13.56 MHz is connected, through matching circuit. 31 and blocking capacitor 32, to the susceptor 24.

The high-frequency generator 28 is connected to high-frequency control section 36 through cable 34. The application of high-frequency voltage is repeatedly started and stopped by the high-frequency generator 28 and high-frequency control section 36, and high-frequency voltage is thereby output at fixed intervals. The high-frequency generator 28 can be initialized to consequently generate a high-frequency voltage of certain power using an outer signal between 0 and 10 volts. For instance, with an outer signal of 0 V, a high-frequency power of 0 W is outputted and with 10 V, 2000 W power is outputted.

An uneven wave on the order of a voltage of 10 V and a voltage-application time of several tens of milliseconds is generated by means of the high-frequency control section 36, while adapting 0 V and 10 V to ON and OFF states of the high-frequency generator 28, respectively. It is thereby made possible to apply a desired uneven high-frequency voltage to the lower electrode 24.

On the upper surface of the susceptor 24 is provided electrostatic chuck 38 for providing and holding semiconductor wafer W thereon by means of Coulomb force. The electrostatic chuck 38 is constructed by attaching plate-shaped copper foil 38A between polyimide films. High-voltage DC power source 40 for attracting the semiconductor wafer W to the surface of the chuck 38 by means of Coulomb force generated by the electric field, is connected to the copper foil 38A.

Upper electrode 42 connected to the ground is provided in the upper portion of the processing vessel 16. The upper electrode 42 is made of, e.g. amorphous carbon or SiC. Its interior is formed to be hollow. The upper electrode 42 is provided with gas introduction port 46 for introducing etching gas into the hollow interior, and with a number of gas diffusion holes on the entire surface facing the semiconductor wafer W. Diffusion plate (not shown) for diffusing and blowing out etching gas into the processing vessel 16 from the diffusion holes 44 is provided in the hollow interior of the upper electrode 42. In other words, the upper electrode 42 has a shower head structure.

Gas supply pipe 50 having a valve provided on its way is connected to the gas introduction port 46. The tip end of the supply pipe 50 is divided into three branch pipes 52, 54 and 56. Valves 58, 60, 62, mass flow controllers 64, 66, 68 for controlling flow, and gas sources 70, 72, 74 filled with different gases are connected to the branch pipes 52, 54 and 56, respectively. They form a gas introduction section as a whole.

According to this embodiment, the gas source 70 is filled with, for instance, CF gas such as $CF_4$, $C_2F_6$ and $C_4F_8$ as main etching gas. Besides, the gas source 70 is filled with $H_2$ gas as addition gas. Also, the gas source 72 is filled with Ar gas as carrier gas.

It is possible to replace a combination of etching gas $CF_4$ and $H_2$ gas with a combination of, e.g. $CHF_3$ gas and CO gas, $CH_2F_2$ gas and $CO_2$, or $C_4F_8$ gas and CO gas.

Each of the mass flow controllers 64, 66 and 68 is connected to control section 76 including, e.g. a microcomputer, for controlling gas flow. The control section 76 is also connected to the vacuum pump 19 to control displacement in the processing vessel 16. The control section 76 simultaneously supplies and exhausts gas to thereby keep gas supply amounts constant.

Permanent magnet 78 with N and S poles is arranged above the processing vessel 16. The permanent magnet 78 is attached to rotation drive means including a rotary rod and an electrically-driven motor, for rotating the magnet 78. The rotation of the permanent magnet 78 allows formation of a magnetic field within the processing vessel in a predetermined direction (magnetic field formation means). For example, magnetic field (magnetic lines) 8 of 10–1000 G oersted is formed above and parallel to the semiconductor wafer W.

Sealing member 80 consisting of O-ring and the like seals a gap between the processing vessel 16 and the upper electrode 42.

Although this embodiment refers to the bipolar magnetron plasma etching apparatus by way of example, it is not restricted to this apparatus. A so-called dipolar magnetron etching apparatus provided with a group of ring-shaped permanent magnets rotating around the peripheral side wall of the processing vessel 16 can be utilized, as well.

Next, an explanation will be given as to an etching method using the apparatus having the above-described structure.

The semiconductor wafer W as a to-be-processed object is carried into etching apparatus 14 through a gate valve from a load-locking chamber (not shown), and is placed on the electrostatic chuck 38. High-frequency DC voltage is applied to the electrostatic chuck 38 and the semiconductor wafer W is attracted to and held on the chuck 38 by means of Coulomb force.

While evacuating atmosphere from the processing vessel 16, a mixture of $CF_4$ gas, $H_2$ gas and Ar gas, whose flow rate may be controlled, is introduced from the etching gas sources 70, 72 and 74 into the processing vessel 16, keeping its interior at a predetermined processing pressure on the order of 40 mTorr.

High-frequency voltage is applied across the upper electrode 42 and the lower electrode, i.e. susceptor 24, simultaneously with the supply of etching gas, so that the introduced etching gas is activated to generate plasma. The resultant energy causes etching gas to be gradually dissociated to thereby generate various active elements. The active elements etch the to-be-etched layer or film on the wafer surface.

In this embodiment, a high-frequency power of, e.g. 13.56 MHz applied to the susceptor 24 from the high-frequency generator 28 does not continuously maintain fixed outputs. As shown in FIG. 2, it varies unevenly in such a manner that the application of power is started and stopped. Due to this, the temperature of electrons in plasma is lowered and the electrons return to their original position, with the result that plasma is prevented from being unevenly distributed above the wafer.

As shown in the upper waveform of FIG. 2, the application of the outputted high-frequency power is started and stopped by outputting uneven outer signal S1 of 10 V in voltage and several tens milliseconds in voltage-application time T1 to the high-frequency generator 28. The high-frequency power outputted from the high-frequency generator 28 has, as shown in the lower waveform of FIG. 2, the same power-application time T1 as the outer signal S1 and is applied to the susceptor 24.

Also, the magnetic field 8 generated from the rotating permanent magnet 78 regularly occurs in the processing space above the wafer W in a parallel manner to the wafer surface. However, as mentioned above, high-frequency voltage is unevenly applied to the electric field perpendicular to the wafer surface and the field appears and disappears at fixed intervals. Therefore, drift force represented by E (electric field)×B (magnetic field) and generated in electrons within plasma by Fleming's left-hand rule disappears when the application of high-frequency power is stopped. Electrons which tend to be unevenly distributed above the wafer surface, return to their original position while the electric field is disappearing, thereby hindering electrons from being unevenly distributed and preventing a portion where electrons are undesirably collected from occurring. This makes it possible to not only uniformly distribute plasma in the processing space but also prevent charge-up damage caused by the portion where electrons are undesirably collected from occurring.

In this case, the high-frequency voltage is equal to an uneven wave varying between 0 V and a positive voltage. At the application time, a power of, e.g. 2000 W is supplied. In order to control power supply, it is necessary to vary the outer signal S1 in the range of 0 to 10 V. To control the high-frequency power application time or the high-frequency power-application stop time, it is necessary to change the length of the power application time T1 or the power-application stop time T2.

If power-application time T1 is excessively long, as already described in the Prior Art, E×B drift occurs, resulting in the uneven distribution of plasma. For the purpose of preventing this, the power-application time T1 is set at, for example, not more than several tens milliseconds.

Also, the moment the application of high-frequency power is stopped, the perpendicular electric field disappears. However, ions excited in plasma do not disappear soon but rather has a life of about several tens milliseconds. During that time, active elements still exist, with the result that the wafer surface goes on to be etched.

This follows that plasma disappears if the application of high-frequency power is stopped for a period of time longer than the life of ions. If trying to perform continuous plasma etching without generating E×B drift, it is necessary to set high-frequency power-application stop time T2 at a period shorter than the life of ions.

If performing intermittent etching, the stop time T2 can be set longer than the life of ions.

As mentioned above, high-frequency voltage is applied to the electrodes unevenly in such a way as to be in ON and OFF states. Therefore, if voltage is applied thereto, electrons in plasma tend to be unevenly distributed by E×B drift. If the application of voltage is stopped, the electric field disappears and a force acting on the electrons in plasma is gone, with the result that electrons return to their original position. At this time, due to the fact that the mass of electrons is small, the speed at which electrons return to their original position is quite high. This makes it possible to get rid of a portion where electrons are undesirably collected, to make the distribution of plasma uniform and make etching process uniform. In addition, there occurs no potential difference above the wafer surface any longer and charge-up damage can be prevented.

Although this embodiment illustrates a case where a high-frequency power of 2000 W is applied unevenly to the electrodes, the power is not restricted to 2000 W. It can be changed to desired values in the range of 0 to 2000 W. The high-frequency pulse generating mechanism is not restricted to the high-frequency control section 36, but can be replaced with other mechanisms.

Moreover, the to-be-processed object is not restricted to a semiconductor wafer, but can be replaced with other material such as an LCD substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An etching method, comprising the steps of:

forming a magnetic field parallel to a surface of a to-be-processed object, which is placed in a processing vessel, and introducing etching gas into the processing vessel; and applying high-frequency voltage for generating plasma between a pair of electrodes, which are provided to face each other in the processing vessel, and stopping application of the high-frequency voltage to the electrode at fixed intervals, to thereby decrease electrons in the plasma over the surface of the to-be-processed object, thereby uniformly plasma-etching the to-be-processed object.

2. An etching method according to claim 1, wherein voltage-application time is set at not more than several hundredths of a second.

3. An etching method according to claim 1, wherein voltage-application stop time is set at a period shorter than a life of electrons in plasma.

4. An etching method according to claim 3, wherein the voltage-application stop time is set at not more than several hundredths of a second.

5. An etching method according to claim 1, further comprising a step of introducing etching gas into the processing vessel and exhausting etching gas in the processing vessel, to thereby control etching gas amounts in the processing vessel.

6. An etching method according to claim 1, wherein voltage-application stop time is set at a period shorter than a life time of electrons in plasma.

7. An etching method, comprising the steps of:

forming a magnetic field parallel to a surface of a to-be-processed object which is placed between a pair of electrodes to face each other in a processing vessel;

introducing etching gas into the processing vessel; and applying high-frequency voltage between the electrodes for generating plasma therebetween, stopping application of the high-frequency voltage between the electrodes at intervals, the high-frequency application time being shorter than a time in which ExB drift phenomenon becomes conspicuous, and the high-frequency application stop time being shorter than a time in which plasma disappears, to thereby decrease uneven distribution of electrons in plasma over the surface of the to-be-processed object, thereby evenly plasma-etching the to-be-processed object.

* * * * *